US010809312B2

(12) United States Patent
Ikushima et al.

(10) Patent No.: US 10,809,312 B2
(45) Date of Patent: Oct. 20, 2020

(54) ELECTRIC LEAKAGE DETECTOR

(71) Applicant: Panasonic Intellectual Property Management Co., Ltd., Osaka (JP)

(72) Inventors: Tsuyoshi Ikushima, Nara (JP); Tomokazu Nishigaki, Kanagawa (JP); Naoki Fukuo, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 32 days.

(21) Appl. No.: 16/462,233

(22) PCT Filed: Nov. 16, 2017

(86) PCT No.: PCT/JP2017/041191
§ 371 (c)(1),
(2) Date: May 19, 2019

(87) PCT Pub. No.: WO2018/101053
PCT Pub. Date: Jun. 7, 2018

(65) Prior Publication Data
US 2019/0331725 A1    Oct. 31, 2019

(30) Foreign Application Priority Data

Nov. 29, 2016  (JP) ................................. 2016-231840

(51) Int. Cl.
*G01R 31/02* (2006.01)
*G01R 15/18* (2006.01)
(Continued)

(52) U.S. Cl.
CPC ............ *G01R 31/50* (2020.01); *G01R 15/18* (2013.01); *G01R 19/16538* (2013.01); *H03K 19/20* (2013.01)

(58) Field of Classification Search
None
See application file for complete search history.

(56) References Cited

U.S. PATENT DOCUMENTS 10,396,544 B2 *   8/2019   Iwami .................... G01R 19/20
2013/0215538 A1   8/2013   Gotou
(Continued)

FOREIGN PATENT DOCUMENTS

CN         104067134 B     10/2016
JP         2012-125053 A    6/2012
(Continued)

OTHER PUBLICATIONS

International Search Report and Written Opinion for corresponding Application No. PCT/JP2017/041191, dated Jan. 23, 2018.

*Primary Examiner* — Jermele M Hollington
(74) *Attorney, Agent, or Firm* — Renner, Otto, Boisselle & Sklar, LLP

(57) ABSTRACT

A first decision unit of an AC leakage detection section outputs a first output signal with a signal level depending on the level of a corrected first voltage signal output from a correction unit relative to a first threshold value. An excitation unit of a DC leakage detection section applies, to an excitation coil, an excitation voltage having an excitation frequency. A DC component detection unit outputs a second voltage signal representing magnitude of a DC component of the voltage obtained by a current-detecting resistor. A second decision unit outputs a second output signal having a voltage level depending on the level of the second voltage signal relative to a second threshold value. The DC leakage detection section includes a low-pass filter provided between an input terminal electrically connected to a connection point between the excitation coil and the current-detecting resistor and the excitation coil.

6 Claims, 8 Drawing Sheets

(51) Int. Cl.
    *G01R 19/165*    (2006.01)
    *G01R 31/50*    (2020.01)
    *H03K 19/20*    (2006.01)

(56) References Cited

U.S. PATENT DOCUMENTS

| | | | |
|---|---|---|---|
| 2014/0320112 | A1 | 10/2014 | Nodera |
| 2015/0276816 | A1* | 10/2015 | Yoshida ............. G01R 19/0092 |
| | | | 324/244 |
| 2018/0131173 | A1 | 5/2018 | Iwami |
| 2019/0331724 | A1* | 10/2019 | Ikushima ............... G01R 31/50 |
| 2019/0372335 | A1* | 12/2019 | Kawamoto .......... H05K 5/0047 |

FOREIGN PATENT DOCUMENTS

| | | |
|---|---|---|
| JP | 2013-38047 A | 2/2013 |
| JP | 2016-13043 A | 1/2016 |
| TW | 201245728 A | 11/2012 |
| WO | 2016/002216 A1 | 1/2016 |
| WO | 2016/170731 A1 | 10/2016 |

\* cited by examiner

ELECTRIC LEAKAGE DETECTOR

TECHNICAL FIELD

The present invention generally relates to an electric leakage detector, and more particularly relates to an electric leakage detector with the ability to detect an AC leakage current and a DC leakage current.

BACKGROUND ART

An electric leakage detector for use as an earth leakage circuit breaker has been known in the art (see, for example, Patent Literature 1). The electric leakage detector includes a zero-phase current transformer for detecting AC components of a leakage current and a flux-gate type DC current transformer for detecting DC components of the leakage current.

The zero-phase current transformer includes a circular magnetic core and a secondary winding wound around the magnetic core. The DC current transformer also includes a circular magnetic core and a secondary winding wound around the magnetic core.

The electric leakage detector includes an excitation circuit connected to the secondary winding of the DC current transformer. This excitation circuit feeds an excitation current using the secondary winding of the DC current transformer as an excitation coil, and outputs, as an output voltage, a voltage representing a variation in the excitation current.

The electric leakage detector further includes an AC leakage current detector circuit, an AC rated sensitivity setting unit, a DC leakage current detector circuit, a DC rated sensitivity setting unit, and an OR logic circuit. The OR logic circuit receives an output signal of a second comparator of the AC rated sensitivity setting unit and an output signal of a DC component comparator of the DC rated sensitivity setting unit.

Also, a charging controller, connected, via a charging cable, to a charging connector to be connected to a charging inlet of an electric vehicle and also connected, via a power cable, to an external power supply, in order to control charging a rechargeable battery of the electric vehicle, is required to satisfy the IEC 62752 standard. The IEC 62752 standard defines not only the Type A function of providing protection from a pulsating leakage current but also how to detect a DC leakage current and how to provide protection from the DC leakage current.

When used in a CCID, for example, such an electric leakage detector including the zero-phase current transformer and the flux-gate type DC current transformer is required to have improved detection accuracy.

CITATION LIST

Patent Literature

Patent Literature 1: JP 2013-38047 A

SUMMARY OF INVENTION

An object of the present invention is to provide an electric leakage detector with the ability to improve the detection accuracy.

An electric leakage detector according to an aspect of the present invention includes an AC leakage detection section, a DC leakage detection section, and an OR circuit. The AC leakage detection section detects an AC leakage current. The DC leakage detection section detects a DC leakage current. The OR circuit calculates a logical sum of a first output signal output from the AC leakage detection section and a second output signal output from the DC leakage detection section. The AC leakage detection section includes a first core, a secondary coil, a current detection unit, a correction unit, and a first decision unit. The first core allows a plurality of conductors to pass therethrough. The secondary coil is wound around the first core. The current detection unit outputs a first voltage signal with a signal level corresponding to amplitude of an alternating current flowing through the secondary coil. The correction unit outputs a corrected first voltage signal by decreasing the signal level of the first voltage signal more and more significantly as an excess of a frequency of the first voltage signal output from the current detection unit over a predetermined frequency increases. The first decision unit outputs the first output signal with a signal level switching between a high level and a low level depending on whether the corrected first voltage signal output from the correction unit is greater than, or equal to or less than, a first threshold value. The DC leakage detection section includes a second core, an excitation coil, a current-detecting resistor, an excitation unit, a DC component detection unit, a second decision unit, and a low-pass filter. The second core allows the plurality of conductors to pass therethrough. The excitation coil is wound around the second core. The current-detecting resistor converts a current flowing through the excitation coil into a voltage. The excitation unit applies, to the excitation coil, an excitation voltage, having an excitation frequency with a voltage level alternately changing between a first voltage value higher than a reference voltage value and a second voltage value lower than the reference voltage value, based on a result of comparison between the voltage obtained through conversion by the current-detecting resistor and a threshold voltage. The DC component detection unit outputs a second voltage signal representing magnitude of a DC component of the voltage obtained through conversion by the current-detecting resistor. The second decision unit outputs a second output signal having a voltage level switching between a high level and a low level depending on whether the second voltage signal output from the DC component detection unit is greater than, or equal to or less than, a second threshold value. The low-pass filter is provided between an input terminal of the excitation unit and the excitation coil. The input terminal is electrically connected to a connection point between the excitation coil and the current-detecting resistor.

DESCRIPTION OF EMBODIMENTS

Figure 1:
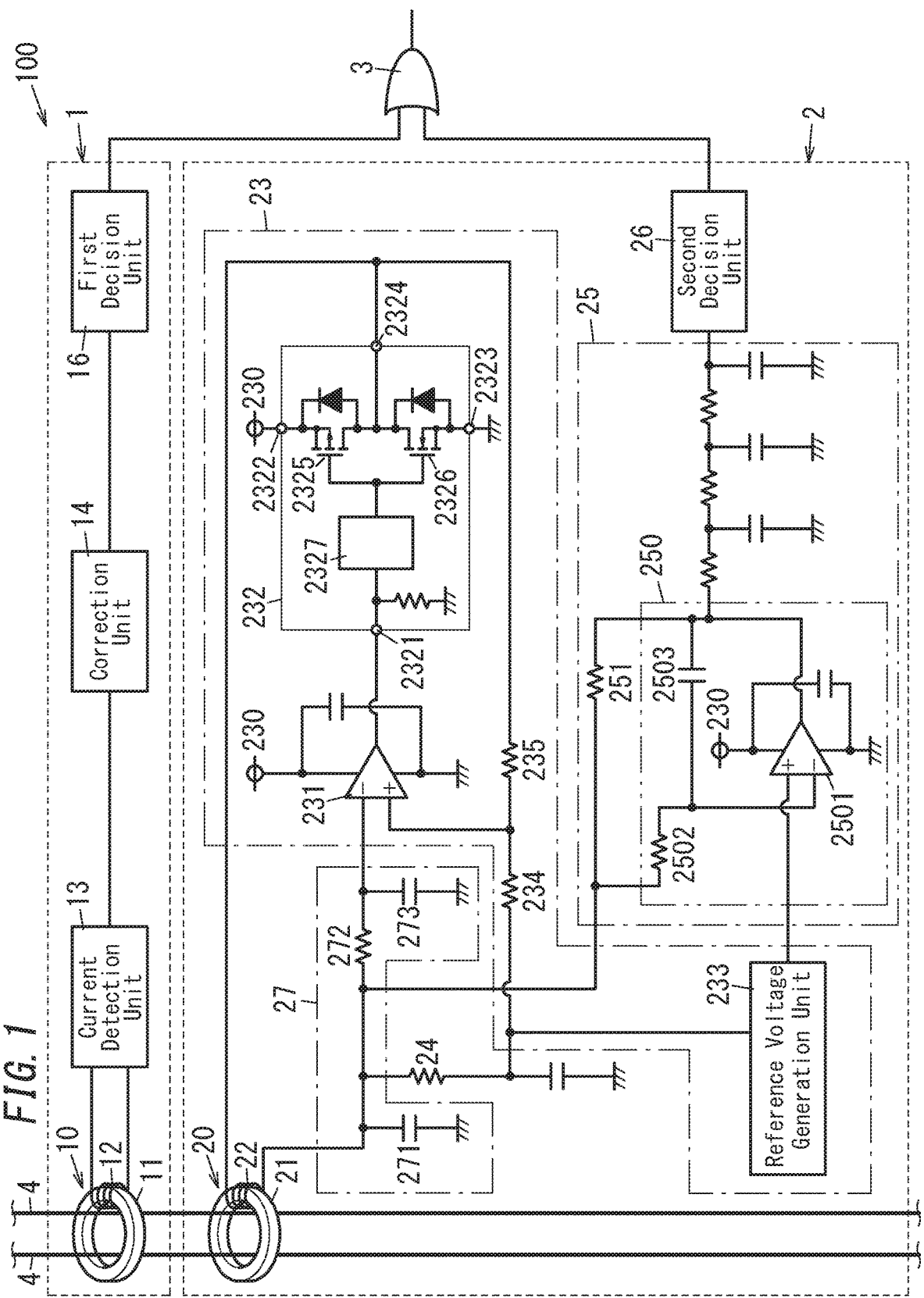
FIG. 1 is a schematic circuit diagram of an electric leakage detector according to an embodiment of the present invention.

Note that an exemplary embodiment to be described below is only one of various embodiments of the present invention and should not be construed as limiting. Rather, the embodiment may be readily modified in various manners depending on a design choice or any other factor without departing from a true spirit and scope of the present invention.

Embodiment

An electric leakage detector 100 according to an exemplary embodiment will be described with reference to FIGS. 1-6.

The electric leakage detector 100 may be used, for example, in a charging control unit for charging the rechargeable battery of an electric motor vehicle. Examples of electric motor vehicles include electric vehicles and hybrid vehicles. The charging control unit includes a charging controller, a charging cable, a charging connector (power feeding plug), a power cable, and a power plug. The charging controller is interposed between one end of the power cable and one end of the charging cable to control charging the rechargeable battery of an electric motor vehicle by an external AC power supply (such as a commercial power supply). In this case, the electric motor vehicle includes a DC power supply unit for converting AC power supplied from an AC power supply into DC power to charge a rechargeable battery with the DC power. The charging cable is a cable for electrically connecting the charging controller to the rechargeable battery of the electric motor vehicle. The charging connector is provided for the other end of the charging cable and connected detachably to a charging inlet (charging port) of the electric motor vehicle. The power cable is a cable for electrically connecting the charging controller to an AC power supply. The power plug is provided for the other end of the power cable and connected detachably to an outlet. The charging controller includes a case and a charge circuit interrupt device (CCID) provided for a printed wiring board housed in the case. In the charging control unit, the power cable and the charging cable are extended from the case of the charging controller. The charging controller detects the state of connection of the charging cable to the electric motor vehicle and a charging level of the rechargeable battery in accordance with a control pilot signal input through the charging cable.

In the case of the charging controller, provided are a plurality of (e.g., two) linear conductors 4 (see FIG. 1) that electrically connect the power cable and the charging cable together. Therefore, in the charging control unit, the AC current supplied from the AC power supply to the DC power supply unit of the electric motor vehicle flows through the power cable, the plurality of conductors 4, and the charging cable.

The electric leakage detector 100 forms part of the CCID and implemented on the printed wiring board.

The electric leakage detector 100 includes an AC leakage detection section 1 for detecting an AC leakage current in a plurality of (e.g., two) conductors 4, a DC leakage detection section 2 for detecting a DC leakage current in the plurality of conductors 4, and an OR circuit 3. The AC leakage detection section 1 outputs a first output signal with a signal level switching, depending on the result of detection of the AC leakage current, between a low level and a high level. The signal level of the first output signal is low when the AC leakage detection section 1 detects no AC leakage current. The signal level of the first output signal is high when the AC leakage detection section 1 detects any AC leakage current. The DC leakage detection section 2 outputs a second output signal with a signal level switching, depending on the result of detection of the DC leakage current, between a low level and a high level. The signal level of the second output signal is low when the DC leakage detection section 2 detects no DC leakage current. The signal level of the second output signal is high when the DC leakage detection section 2 detects any DC leakage current. The OR circuit 3 calculates a logical sum of the first output signal output from the AC leakage detection section 1 and the second output signal output from the DC leakage detection section 2. Therefore, the output signal of the OR circuit 3 becomes low when the first output signal and the second output signal are both low. The output signal of the OR circuit 3 becomes high when at least one of the first output signal or the second output signal is high.

Next, the electric leakage detector 100 will be described in further detail.

The AC leakage detection section 1 includes a first core 11, a secondary coil 12, a current detection unit 13, a correction unit 14, and a first decision unit 16.

The first core 11 allows a plurality of conductors 4 to pass therethrough. For example, the first core 11 may have a ring shape. In this embodiment, the first core 11 may be implemented as a wound magnetic core, for example. The wound magnetic core is formed by winding a ribbon-shaped (strip-shaped) magnetic member in rolls. The magnetic member is suitably made of a soft magnetic material. In this embodiment, the soft magnetic material may be permalloy, for example.

The first core 11 is housed in a first core case with electrical insulation properties. For example, the first core case may have a hollow ring shape. The first core case is suitably made of a non-magnetic material. Examples of the non-magnetic materials include polybutylene terephthalate (PBT) and polypropylene (PP).

The secondary coil 12 is configured as a copper wire wound around the first core 11. In this case, the copper wire forming the secondary coil 12 is wound around the first core case housing the first core 11. In other words, the copper wire forming the secondary coil 12 is wound around the first core 11 via the first core case.

In the AC leakage detection section 1, a first current transformer 10 including the first core 11 and the secondary coil 12 is a zero-phase current transformer for detecting zero-phase currents in the plurality of conductors 4 passed through the first core 11.

The current detection unit 13 outputs a first voltage signal, of which the signal level represents the amplitude of an alternating current flowing through the secondary coil 12. The current detection unit 13 may be implemented as, for example, a current-detecting resistor (first current-detecting resistor) connected between both ends of the secondary coil 12. The first current-detecting resistor converts the alternating current flowing through the secondary coil 12 into a first voltage signal.

Figure 2:
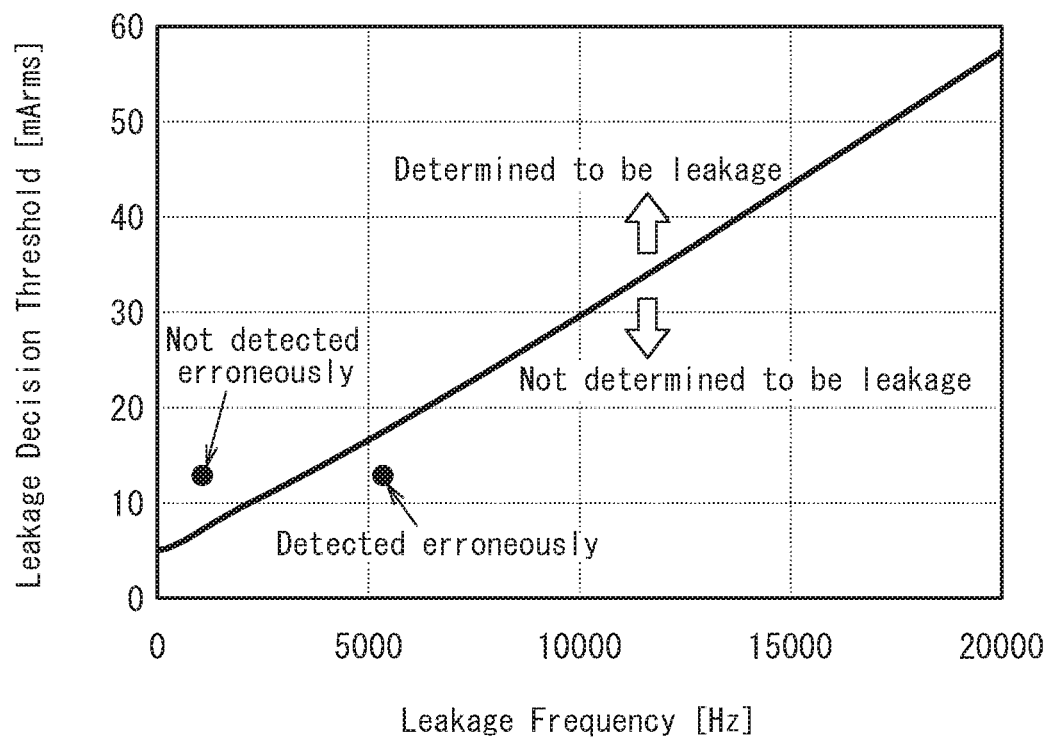
FIG. 2 is a graph showing an exemplary relationship between an AC leakage decision threshold and the frequency.

A leakage decision threshold for determining whether or not there is any AC leakage current in a CCID is standardized by the UL2331-2 standard, for example, to increase, as shown in FIG. 2, as the leakage frequency increases, considering the difference in impact on a human body according to the frequency. In this case, the "leakage decision threshold" is called a "permitted trip threshold" according to the UL standard. That is to say, the AC leakage decision threshold for a CCID is standardized such that the lower the leakage frequency is, the higher the sensitivity is and that the higher the leakage frequency is, the lower the sensitivity is. In the following description, a curve defining a leakage decision threshold on a leakage frequency basis will be hereinafter referred to as a "let-go curve."

Figure 3:
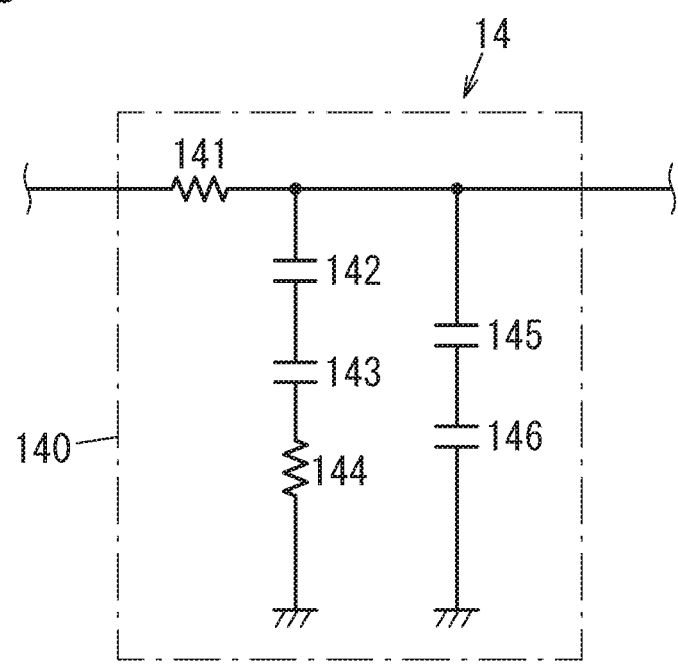
FIG. 3 is a circuit diagram illustrating an exemplary configuration for a first low-pass filter in an electric leakage detector according to the embodiment of the present invention.

In this AC leakage detection section 1, the correction unit 14 is provided between the current detection unit 13 and the first decision unit 16 to eliminate the need to change the first threshold value V1 according to the leakage frequency. The first threshold value V1 is used by the first decision unit 16 to determine whether or not there is any AC leakage current. The correction unit 14 is configured to lower the signal level of the first voltage signal and output a corrected first voltage signal as the excess of the frequency of the first voltage signal output from the current detection unit 13 over a predetermined frequency (of 100 Hz, for example) increases. In short, the correction unit 14 makes correction by adding a varying weight to the first voltage signal according to the frequency. The correction unit 14 may be implemented as, for example, a low-pass filter 140 (hereinafter referred to as a "first low-pass filter 140") provided between the current detection unit 13 and the first decision unit 16. According to the frequency-gain characteristic FG1 (see FIG. 6) of the first low-pass filter 140, the gain (filter gain) decreases as the excess of the frequency over 300 Hz increases. The first low-pass filter 140 may be configured as a combination of two resistors 141 and 144 and four capacitors 142, 143, 145, and 146 as shown in FIG. 3. In the first low-pass filter 140, a series circuit of the resistor 141, capacitor 142, capacitor 143, and resistor 144 is connected between both terminals of the current detection unit 13. In addition, in the first low-pass filter 140, a series circuit of the capacitors 145 and 146 is connected in parallel to the series circuit of the capacitor 142, capacitor 143, and resistor 144. Furthermore, in the first low-pass filter 140, the first decision unit 16 (see FIG. 1) is connected between both terminals of the series circuit of the capacitors 145 and 146.

The first decision unit 16 outputs a first output signal having a signal level that switches between a high level and a low level depending on whether the corrected first voltage signal output from the correction unit 14 is greater than, or equal to or less than, the first threshold value V1. That is to say, the first decision unit 16 is a decision circuit for determining, by comparing the corrected first voltage signal output from the correction unit 14 with a preset first threshold value V1, whether or not the corrected first voltage signal has exceeded the first threshold value V1. The first decision unit 16 may be implemented as, for example, a comparator.

When the first decision unit 16 finds the signal level of the corrected first voltage signal output from the correction unit 14 greater than the first threshold value V1, the signal level of the first output signal changes from low level into high level. In this embodiment, in the AC leakage detection section 1, the first threshold value V1 for use in the first decision unit 16 is constant irrespective of the leakage frequency. However, providing the correction unit 14 substantially allows the first threshold value V1 to be increased as the leakage frequency increases. In other words, the AC leakage detection section 1 sets the frequency-gain characteristic of the correction unit 14 (i.e., the frequency-gain characteristic FG1 of the first low-pass filter 140) such that as the frequency of the AC leakage current increases, the first threshold value V1 for use in the first decision unit 16 also increases virtually.

The DC leakage detection section 2 is a flux-gate type current sensor. In this embodiment, the DC leakage detection section 2 includes a second core 21, an excitation coil 22, a current-detecting resistor 24, an excitation unit 23, a DC component detection unit 25, a second decision unit 26, and a low-pass filter 27.

The second core 21 allows the plurality of conductors 4 to pass therethrough. For example, the second core 21 may have a ring shape. In this embodiment, the second core 21 may be implemented as a wound magnetic core, for example. The wound magnetic core is formed by winding a ribbon-shaped magnetic member in rolls. The magnetic member is suitably made of a soft magnetic material. In this embodiment, the soft magnetic material may be permalloy, for example. The DC leakage detection section 2 suitably adopts a permalloy with higher magnetic permeability than a silicon steel sheet as a material for the second core 21. This allows the DC leakage detection section 2 to detect, with high sensitivity, a direct current on the order of several mA (e.g., a DC leakage current of 6 mA or more).

The second core 21 is housed in a second core case with electrical insulation properties. For example, the second core case may have a hollow ring shape. The second core case is suitably made of a non-magnetic material. Examples of the non-magnetic materials include PBT and PP.

The excitation coil 22 is configured as a copper wire wound around the second core 21. In this case, the copper wire forming the excitation coil 22 is wound around the second core case housing the second core 21. In other words, the copper wire forming the excitation coil 22 is wound around the second core 21 via the second core case.

In the DC leakage detection section 2, a second current transformer 20 including the second core 21 and the excitation coil 22 is a DC current transformer for detecting a DC leakage current in the plurality of conductors 4 passed through the second core 21.

In the DC leakage detection section 2, the current-detecting resistor 24 (hereinafter referred to as a "second current-detecting resistor 24") is connected in series to the excitation coil 22. Thus, the current flowing through the excitation coil 22 is converted by the second current-detecting resistor 24 into a voltage. In other words, the second current-detecting resistor 24 converts the current flowing through the excitation coil 22 into the voltage. The magnitude of the voltage between both terminals of the second current-detecting resistor 24 is proportional to the amount of the current flowing through the excitation coil 22.

One end of the excitation coil 22 is connected to an output terminal of the excitation unit 23. The other end of the excitation coil 22 is electrically connected to the input terminal of the excitation unit 23 and the second current-detecting resistor 24.

Figure 4A:
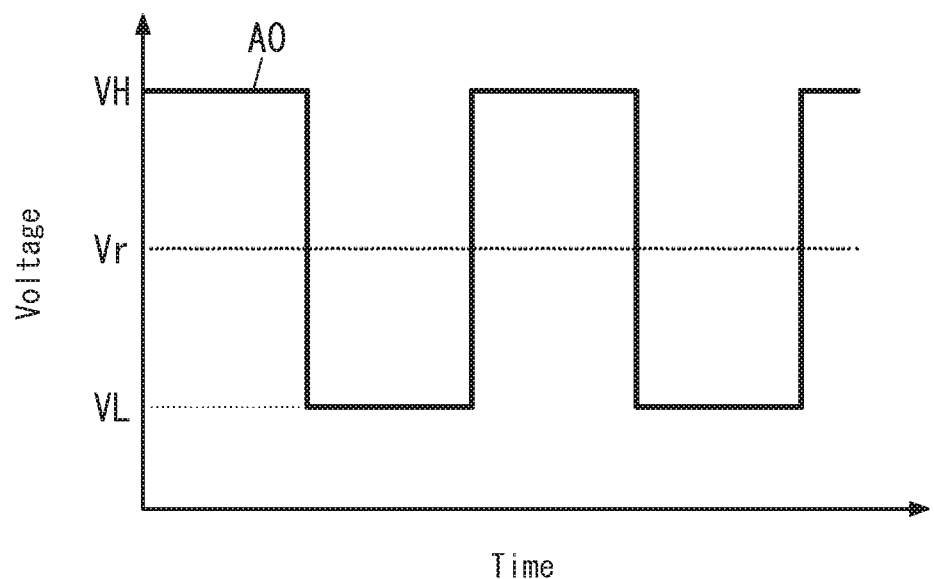
FIG. 4A shows the waveform of an excitation voltage of a DC leakage detection section in the electric leakage detector.
Figure 4B:
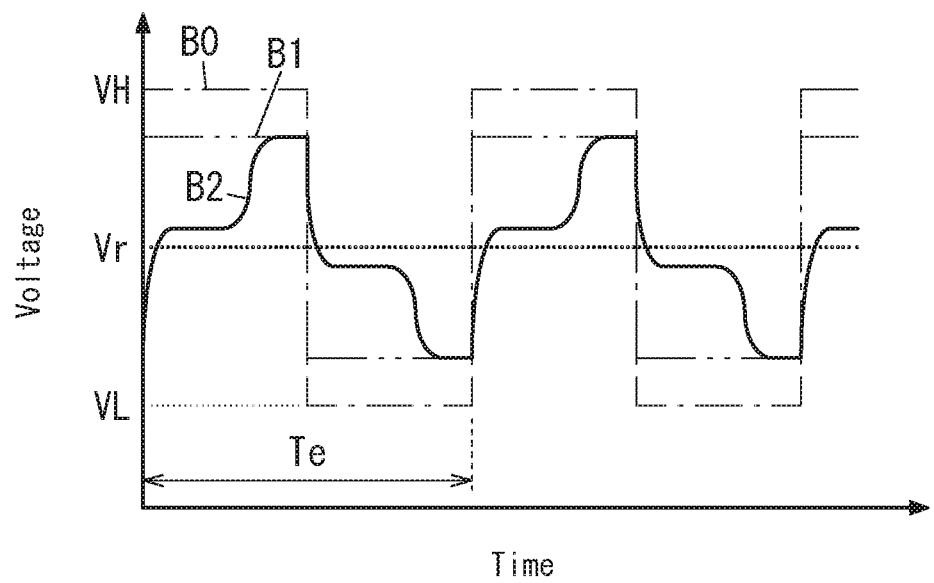
FIG. 4B shows an operating waveform of the DC leakage detection section in the electric leakage detector.

The excitation unit 23 applies an excitation voltage with an excitation frequency to the excitation coil 22. The excitation voltage may be a rectangular wave voltage with an excitation frequency having a voltage level that alternately changes between a first voltage value VH higher than a reference voltage value Vr and a second voltage value VL lower than the reference voltage value Vr as shown in FIG. 4A, for example. The excitation voltage changes, based on a result of comparison between the voltage obtained through conversion by the current-detecting resistor 24 and the threshold voltage, the voltage level alternately between the first voltage value VH and the second voltage value VL. In this example, the reference voltage value Vr, the first voltage value VH, and the second voltage value VL may be 2.5 V, 5 V, and 0 V, respectively. However, these values are only examples and should not be construed as limiting. The absolute value of the difference between the first voltage value VH and the reference voltage value Vr is suitably equal to the absolute value of the difference between the second voltage value VL and the reference voltage value Vr. Also, these absolute values are set to make the second core 21 magnetically saturated. The AC leakage current to be detected by the AC leakage detection section 1 described above may have a frequency of 30 kHz or less, for example. In that case, the excitation frequency suitably falls within the range of approximately 200 Hz to 300 Hz.

The excitation unit 23 is a positive feedback oscillator circuit, and supplies an AC excitation current to the excitation coil 22 by performing an oscillation operation. In this embodiment, the excitation unit 23 includes an operational amplifier 231, a reference voltage generation unit 233, a voltage switching circuit 232, a resistor 234, and a resistor 235. The operational amplifier 231 is driven by a single power supply.

The inverting input terminal of the operational amplifier 231 is electrically connected to a connection point between the excitation coil 22 and the current-detecting resistor 24. The non-inverting input terminal of the operational amplifier 231 is connected to a connection point between the resistors 234 and 235. The output terminal of the operational amplifier 231 is connected to the voltage switching circuit 232.

The reference voltage generation unit 233 is connected to the excitation coil 22 via the current-detecting resistor 24. The voltage value of the output voltage of the reference voltage generation unit 233 is the reference voltage value Vr.

The voltage switching circuit 232 includes an input terminal 2321, a power supply terminal 2322, a ground terminal 2323, and an output terminal 2324. In the excitation unit 23, the output terminal of the operational amplifier 231 is connected to the input terminal 2321 of the voltage switching circuit 232. In addition, in the excitation unit 23, the output terminal 2324 of the voltage switching circuit 232 is connected to a connection point between the current-detecting resistor 24 and the reference voltage generation unit 233 via a series circuit of the resistors 234 and 235.

In the voltage switching circuit 232, the power supply terminal 2322 is connected to the control power supply 230, and the ground terminal 2323 is connected to the ground. The supply voltage supplied by the control power supply 230 may have a voltage value Va of 5 V, for example. The ground potential is 0 V. In the voltage switching circuit 232, a series circuit of a high-side MOSFET 2325 and a low-side MOSFET 2326 is connected between the power supply terminal 2322 and the ground terminal 2323. The high-side MOSFET 2325 is implemented as a p-channel enhancement MOSFET. The low-side MOSFET 2326 is implemented as an n-channel enhancement MOSFET. In the voltage switching circuit 232, the source terminal of the high-side MOSFET 2325 is connected to the power supply terminal 2322, and the drain terminal of the high-side MOSFET 2325 is connected to the drain terminal of the low-side MOSFET 2326. Also, in the voltage switching circuit 232, the source terminal of the low-side MOSFET 2326 is connected to the ground terminal 2323. Furthermore, in the voltage switching circuit 232, the respective gate terminals of the high-side MOSFET 2325 and low-side MOSFET 2326 are connected together. Furthermore, in the voltage switching circuit 232, the respective drain terminals of the high-side MOSFET 2325 and low-side MOSFET 2326 are connected to the output terminal 2324. The voltage switching circuit 232 further includes a control logic circuit 2327 connected to the input terminal 2321.

The control logic circuit 2327 is also connected to the respective gate terminals of the high-side MOSFET 2325 and low-side MOSFET 2326 to control the respective gate voltages of these MOSFETs 2325 and 2326. When the output signal of the operational amplifier 231 is low level, the control logic circuit 2327 controls the respective gate voltages of the MOSFETs 2325 and 2326 to turn the high-side MOSFET 2325 OFF and turn the low-side MOSFET 2326 ON. As a result, the output voltage (i.e., the voltage between the output terminal and the ground terminal) of the voltage switching circuit 232 becomes approximately equal to 0 V (i.e., equal to the second voltage value VL). On the other hand, when the output signal of the operational amplifier 231 is high level, the control logic circuit 2327 controls the respective gate voltages of the MOSFETs 2325 and 2326 to turn the high-side MOSFET 2325 ON and turn the low-side MOSFET 2326 OFF. As a result, the output voltage of the voltage switching circuit 232 becomes approximately equal to 5 V (i.e., equal to the first voltage value VH).

The voltage switching circuit 232 may be implemented as, for example, a gate driver NJW4841-T1 (product name) manufactured by New Japan Radio Co., Ltd.

Figure 5:
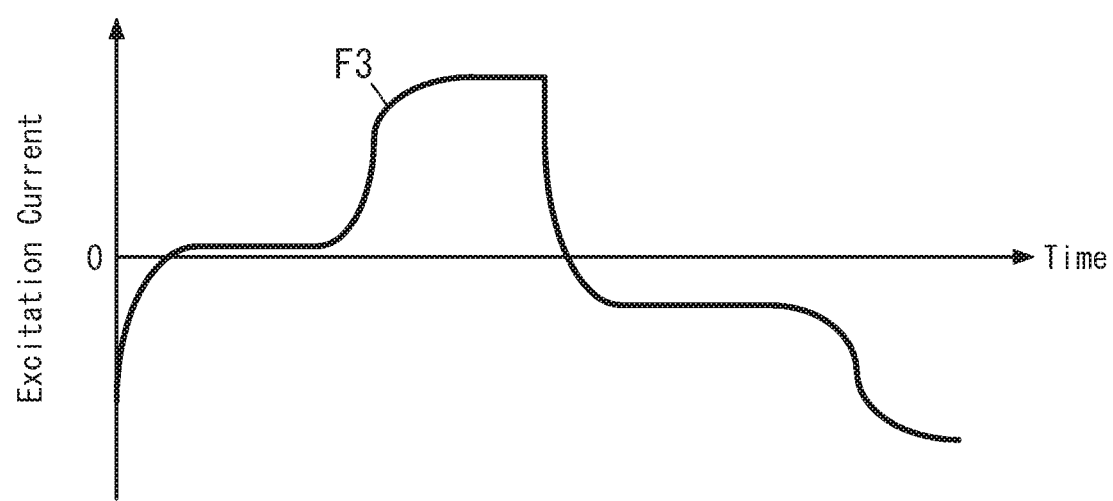
FIG. 5 shows the waveform of an excitation current of the DC leakage detection section in the electric leakage detector.

In the excitation unit 23, the output voltage of the current-detecting resistor 24 (i.e., the voltage at the connection point between the excitation coil 22 and the current-detecting resistor 24) is input to the inverting input terminal of the operational amplifier 231. Also, in the excitation unit 23, a threshold voltage obtained by dividing the differential voltage between the output voltage of the voltage switching circuit 232 and the output voltage of the reference voltage generation unit 233 by the resistance of the two resistors 234 and 235 is input to the non-inverting input terminal of the operational amplifier 231. In this embodiment, the voltage value of the output voltage of the reference voltage generation unit 233 is approximately a half of the voltage value Va of the supply voltage. The threshold voltage changes as indicated by the two-dot chain B1 in FIG. 4B as the voltage level of the excitation voltage varies (as indicated by the solid line A0 in FIG. 4A and the one-dot chain B0 in FIG. 4B). Also, the voltage obtained through conversion by the current-detecting resistor 24 changes as indicated by the solid line B2 in FIG. 4B as the voltage level of the excitation voltage varies. In this case, in the DC leakage detection section 2, the second core 21 is magnetically saturated every half cycle of the excitation voltage. Therefore, a steep current pulse waveform appears every half cycle in the waveform of the excitation current. If no DC leakage current is flowing through the conductors 4, a steep current pulse waveform appears at an interval corresponding to a half cycle of the excitation voltage. In a situation where no DC leakage current is flowing through the conductors 4, if the waveform representing the excitation current with positive polarity has its phase shifted by $\pi$ [radians], then the waveform representing one cycle of the excitation current with positive polarity should ideally be symmetric to the waveform representing one cycle of the excitation current with negative polarity. The impedance of the excitation coil 22 is determined by the resistance, inductance, capacitance, and angular frequency of the excitation coil 22. However, the inductance is proportional to the relative permeability. Therefore, when the second core 21 is magnetically saturated, the impedance of the excitation coil 22 decreases steeply. In short, in the DC leakage detection section 2, when the second core 21 is magnetically saturated, the impedance of the excitation coil 22 decreases so steeply that the amount of the current flowing through the excitation coil 22 increases steeply. In the excitation unit 23, when the voltage obtained through conversion by the current-detecting resistor 24 reaches the threshold voltage, the polarity of the excitation voltage inverts with respect to the reference voltage value Vr. Therefore, when no DC leakage current is flowing through the conductors 4, the excitation current becomes a non-sinusoidal alternating current (the output voltage of the current-detecting resistor 24 proportional to the excitation current changes as indicated by the solid line B2 in FIG. 4B, for example). On the other hand, if any DC leakage current is flowing through the conductors 4, the excitation current becomes a non-sinusoidal alternating current as shown in FIG. 5, for example. One cycle Te of the excitation current is given by 1/fe, where fe is the predetermined excitation frequency.

In the example illustrated in FIG. 5, when the excitation current flows in a positive direction, the magnetic flux generated by the DC leakage current has the same orientation as the magnetic flux generated by the excitation current. Therefore, when a DC leakage current is flowing through the conductors 4, the excitation coil 22 becomes magnetically saturated (i.e., the excitation current becomes magnetically saturated) earlier than a situation where no DC leakage current is flowing through the conductors 4. Also, in the example illustrated in FIG. 5, when the excitation current flows in a negative direction, the magnetic flux generated by the DC leakage current has the opposite orientation from the magnetic flux generated by the excitation current. Therefore, when a DC leakage current is flowing through the conductors 4, the excitation coil 22 becomes magnetically saturated later than in a situation where no DC leakage current is flowing through the conductors 4. When no DC leakage current is flowing through the conductors 4, DC components included in the excitation current become zero. When a DC leakage current is flowing through the conductors 4, a DC component is generated in the excitation current. In addition, a DC component of a voltage, proportional to the DC component of the current, is also generated in the voltage obtained through conversion by the current-detecting resistor 24. The DC leakage current described above may flow, for example, from the DC power supply unit toward the conductors 4 via a grounding point of the AC power supply. When a DC leakage current is flowing through the conductors 4, the current waveform in one cycle of the excitation current comes to have an asymmetric shape in the positive and negative domains thereof with respect to a zero crossing point.

The DC component detection unit 25 outputs a second voltage signal representing the magnitude of the DC component of the voltage obtained through conversion by the current-detecting resistor 24. In other words, the DC component detection unit 25 outputs a second voltage signal with a voltage level proportional to the DC component of the leakage current flowing through the conductors 4. Therefore, the output voltage of the DC component detection unit 25 comes to have a voltage proportional to the magnitude of the DC component included in the current value detected by the current-detecting resistor 24.

The DC component detection unit 25 includes an integration circuit 250 and a feedback resistor 251. The integration circuit 250 includes an operational amplifier 2501, a resistor 2502, one terminal of which is connected to the inverting input terminal of the operational amplifier 2501, and a capacitor 2503 connected between the inverting input terminal and output terminal of the operational amplifier 2501. The integration circuit 250 is configured such that a reference voltage with a reference voltage value Vr is input to the non-inverting input terminal of the operational amplifier 2501 and that a voltage obtained through conversion by the current-detecting resistor 24 is input to the inverting input terminal of the operational amplifier 2501 via the resistor 2502. The feedback resistor 251 is connected between an output terminal of the integration circuit 250 and the other terminal of the resistor 2502.

The second decision unit 26 outputs a second output signal having a voltage level switching between a high level and a low level depending on whether the second voltage signal output from the DC component detection unit 25 is greater than, or equal to or less than, the second threshold value V2. The second decision unit 26 includes a comparison circuit including a comparator, for example. In the second decision unit 26, when the second voltage signal output from the DC component detection unit 25 exceeds the second threshold value V2, the signal level of the second output signal changes from the low level into the high level.

The low-pass filter 27 is provided between an input terminal, electrically connected to a connection point between the excitation coil 22 and the current-detecting resistor 24, of the excitation unit 23 and the excitation coil 22. The low-pass filter 27 will be described in further detail later after the OR circuit 3 has been described.

The OR circuit 3 calculates a logical sum of a first output signal output from the AC leakage detection section 1 and a second output signal output from the DC leakage detection section 2. Therefore, in the electric leakage detector 100, if the first output signal output from the AC leakage detection section 1 and the second output signal output from the DC leakage detection section 2 are both low, then the output signal of the OR circuit 3 becomes low. Meanwhile, in the electric leakage detector 100, if at least one of the first output signal output from the AC leakage detection section 1 or the second output signal output from the DC leakage detection section 2 is high, then the output signal of the OR circuit 3 becomes high.

The CCID described above is configured to cut off, when receiving a high level output signal from the OR circuit 3, for example, the supply of power from the AC power supply to the DC power supply unit. This allows the CCID to cut off, when an error such as electricity leakage occurs, the supply of power from the AC power supply to the DC power supply unit. On the other hand, when receiving a low level output signal from the OR circuit 3, the CCID does not cut off the supply of power from the AC power supply to the DC power supply unit.

The electric leakage detector 100 is used with the plurality of (e.g., two) conductors 4, which electrically connect the power cable and the charging cable together, passed through the first core 11 and the second core 21. In this case, in the electric leakage detector 100, the first current transformer 10 of the AC leakage detection section 1 and the second current transformer 20 of the DC leakage detection section 2 are suitably laid one on top of the other to reduce the overall size of the charging controller.

In this case, the AC leakage detection section 1 needs to operate when the amplitude of the AC leakage current is greater than the leakage decision threshold on the let-go curve, and may not operate when the amplitude of the AC leakage current is less than 80% of the leakage decision threshold.

Figure 7A:
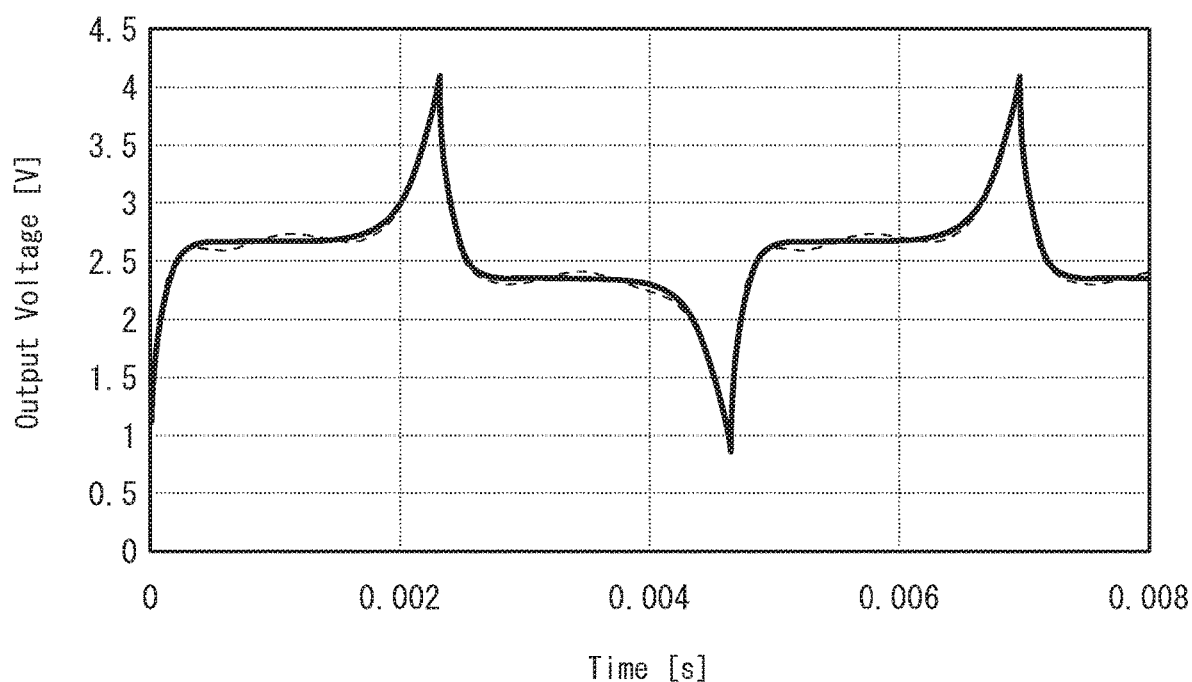
FIG. 7A shows the waveform of a current-detecting resistor in a comparative electric leakage detector.
Figure 7B:
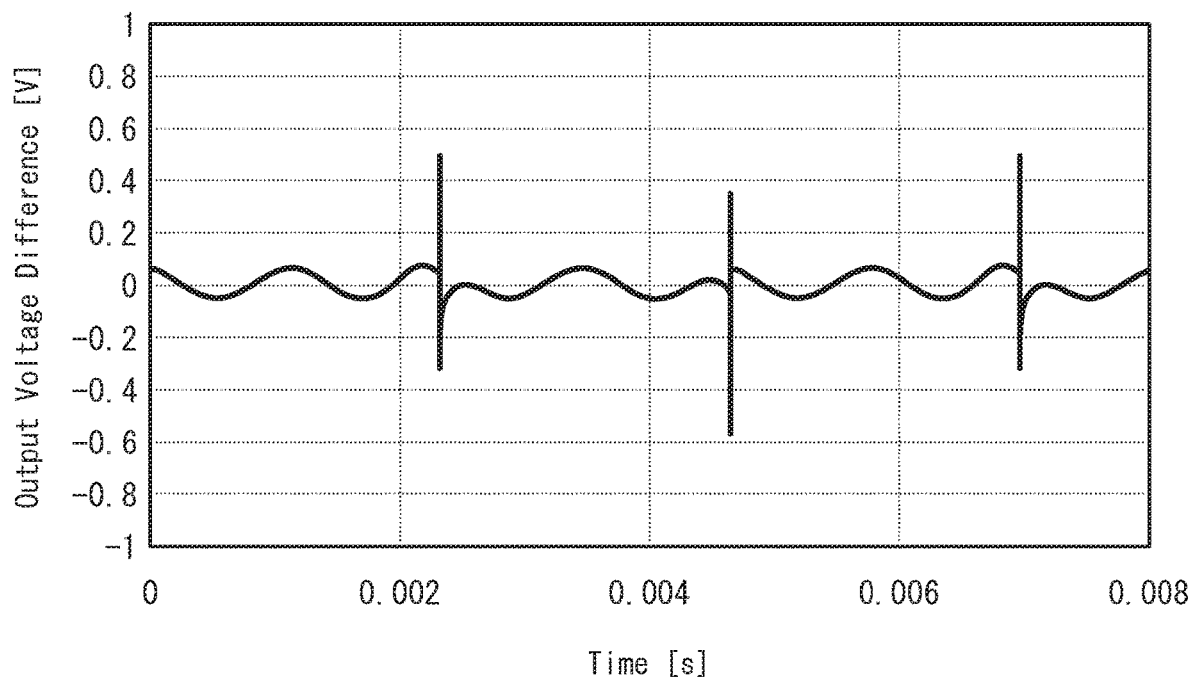
FIG. 7B is a graph showing how the difference in the voltage of the current-detecting resistor between the case of no leakage and the case of any leakage in FIG. 7A varies with time.

In the electric leakage detector 100, however, the output voltage of the current-detecting resistor 24 changes as shown in FIG. 7A depending on whether no AC leakage current or an AC leakage current, of which the frequency is an even number of times as high as the excitation frequency, is flowing through the conductors 4. In FIG. 7A, the output voltage of the current-detecting resistor 24 when no AC leakage current is flowing through the conductors 4 is indicated by the solid curve, and the output voltage of the current-detecting resistor 24 when an AC leakage current is flowing through the conductors 4 is indicated by the dotted curve. In FIG. 7B, the abscissa indicates the time, while the ordinate indicates an output voltage difference obtained by subtracting the output voltage of the current-detecting resistor 24 when no AC leakage current is flowing through the conductors 4 from the output voltage of the current-detecting resistor 24 when an AC leakage current is flowing through the conductors 4 in FIG. 7A. As can be seen from FIG. 7B, when an AC leakage current, of which the frequency is an even number of times as high as the excitation frequency, is flowing through the conductors 4, DC components will be generated in the output voltage of the current-detecting resistor 24 (i.e., part of the excitation current will be converted into DC components). Therefore, in the DC leakage detection section 2 with no low-pass filters 27, even if the amount of the AC leakage current flowing through the conductors 4 is smaller than the leakage decision threshold and if no DC leakage current is flowing through the conductors 4, the output signal of the second decision unit 26 may still go high in some cases. That is to say, the DC leakage detection section 2 with no low-pass filters 27 may erroneously detect, as a DC leakage current, an AC leakage current flowing through the current-detecting resistor 24 at a frequency that is an even number of times as high as the excitation frequency. Thus, in the electric leakage detector 100, if the DC leakage detection section 2 includes no low-pass filters 27, the output signal of the OR circuit 3 may go high when the AC leakage current is flowing in an amount that is too small to be determined to be leakage by the AC leakage detection section 1 (i.e., in an amount less than the leakage decision threshold). In this case, even if the AC leakage is determined to be leakage with the same current amplitude, the detection may or may not be erroneous depending on the frequency as shown in FIG. 2.

Thus, the DC leakage detection section 2 includes the low-pass filter 27 (hereinafter referred to as a "second low-pass filter 27"). The second low-pass filter 27 includes a capacitor 271, a resistor 272, and a capacitor 273. In this embodiment, in the second low-pass filter 27, one terminal of the resistor 272 is connected to the excitation coil 22, and the other terminal of the resistor 272 is connected to the input terminal of the excitation unit 23. In other words, in the second low-pass filter 27, the resistor 272 is provided between the input terminal, connected to the connection point between the excitation coil 22 and the current-detecting resistor 24, of the excitation unit 23 and the excitation coil 22. In addition, in the second low-pass filter 27, one terminal of the capacitor 271 is connected to the connection point between the excitation coil 22 and the resistor 272, and the other terminal of the capacitor 271 is connected to the ground. Furthermore, in the second low-pass filter 27, one terminal of the capacitor 273 is connected to the connection point between the resistor 272 and the input terminal of the excitation unit 23, and the other terminal of the capacitor 273 is connected to the ground. This allows high frequency components of a current flowing from the excitation coil 22 into the second low-pass filter 27 (i.e., components with frequencies higher than the cutoff frequency) to flow through either the capacitor 271 or the capacitor 273.

Figure 6:
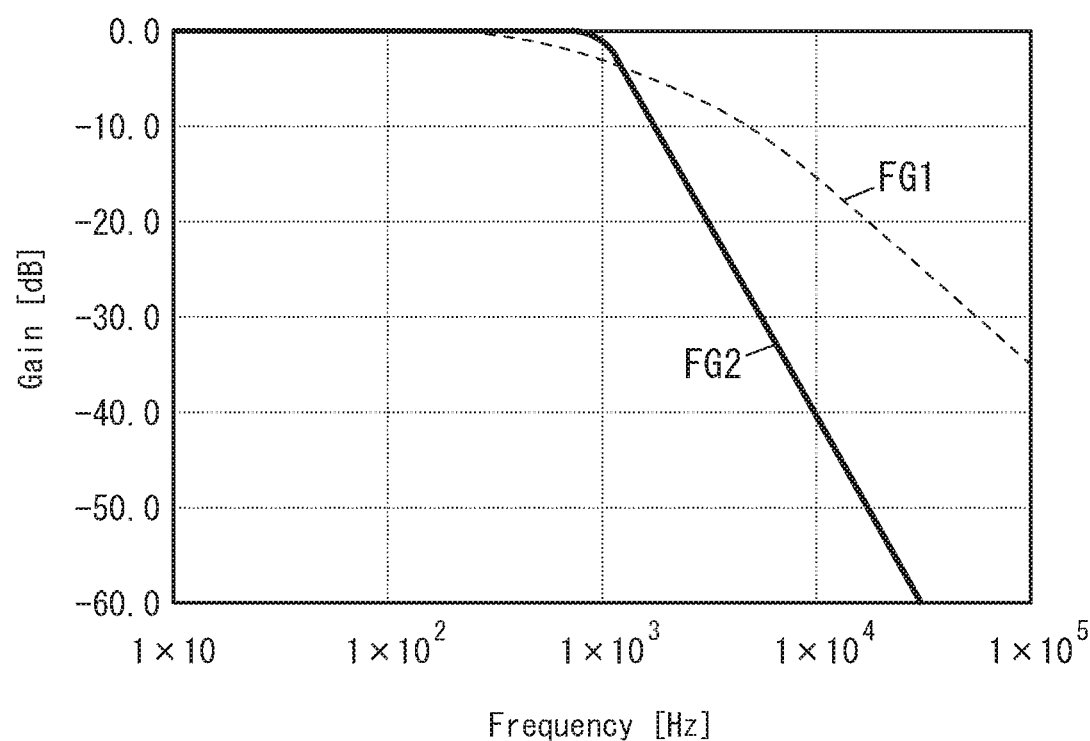
FIG. 6 is a graph showing the frequency-gain characteristics of a first low-pass filter and a second low-pass filter in the electric leakage detector.

The second low-pass filter 27 has a cutoff frequency (i.e., a frequency at which the gain is −3 dB), which is higher than the excitation frequency. In order to attenuate AC leakage components with relatively high frequencies while reducing the distortion of the voltage waveform of the current-detecting resistor 24, the cutoff frequency of the second low-pass filter 27 is suitably five times or more as high as the excitation frequency, for example. For instance, if the excitation frequency is 200 Hz, then the cutoff frequency of the second low-pass filter 27 is suitably equal to or higher than 1000 Hz. The cutoff frequency of the second low-pass filter 27 is suitably determined with the amplitude of an AC leakage current, which will be detected erroneously as a DC leakage current by the DC leakage detection section 2 with no second low-pass filter 27, taken into account. In FIG. 6, the frequency-gain characteristic FG2 of the second low-pass filter 27 and the frequency-gain characteristic FG1 of the first low-pass filter 140 are plotted on the same graph. In FIG. 6, the abscissa indicates the logarithmic axis of frequencies and the ordinate indicates a gain (filter gain) axis, of which the unit is dB. The attenuation curve representing the frequency-gain characteristic FG2 of the second low-pass filter 27 has a steeper gradient (in absolute value) than the attenuation curve representing the frequency-gain characteristic FG1 of the first low-pass filter 140. In this example, the first low-pass filter 140 has a first-order attenuation characteristic in a high frequency range of 10 kHz or more, while the second low-pass filter 27 has a second- or even higher order attenuation characteristic in the high frequency range of 10 kHz or more. In short, the attenuation characteristic of the second low-pass filter 27 is of higher order than the attenuation characteristic of the first low-pass filter 140. The attenuation curve representing the frequency-gain characteristic FG2 of the second low-pass filter 27 and the attenuation curve representing the frequency-gain characteristic FG1 of the first low-pass filter 140 intersect with each other on a single graph in which these two attenuation curves share the same logarithmic axis of frequencies and the same gain axis in dB. In the example illustrated in FIG. 6, the second low-pass filter 27 has a cutoff frequency of 1050 Hz and the first low-pass filter 140 has a cutoff frequency of 1000 Hz.

As can be seen from the foregoing description, an electric leakage detector 100 according to an exemplary embodiment includes an AC leakage detection section 1, a DC leakage detection section 2, and an OR circuit 3 for calculating a logical sum of a first output signal output from the AC leakage detection section 1 and a second output signal output from the DC leakage detection section 2. The AC leakage detection section 1 detects an AC leakage current. The DC leakage detection section 2 detects a DC leakage current. The OR circuit 3 calculates the logical sum of the first output signal output from the AC leakage detection section 1 and the second output signal output from the DC leakage detection section 2. The AC leakage detection section 1 includes a first core 11, a secondary coil 12, a current detection unit 13, a correction unit 14, and a first decision unit 16. The first core 11 allows a plurality of conductors 4 to pass therethrough. The secondary coil 12 is wound around the first core 11. The current detection unit 13 outputs a first voltage signal with a signal level corresponding to amplitude of an alternating current flowing through the secondary coil 12. The correction unit 14 outputs a corrected first voltage signal by decreasing the signal level of the first voltage signal more and more significantly as an excess of a frequency of the first voltage signal output from the current detection unit 13 over a predetermined frequency increases. The first decision unit 16 outputs the first output signal with a signal level switching between a high level and a low level depending on whether the corrected first voltage signal output from the correction unit 14 is greater than, or equal to or less than, a first threshold value V1. The DC leakage detection section 2 includes a second core 21, an excitation coil 22, an excitation unit 23, a current-detecting resistor 24, a DC component detection unit 25, a second decision unit 26, and a low-pass filter 27. The second core 21 allows the plurality of conductors 4 to pass therethrough. The excitation coil 22 is wound around the second core 21. The excitation unit 23 applies, to the excitation coil 22, an excitation voltage, having an excitation frequency with a voltage level alternately changing between a first voltage value VH higher than a reference voltage value Vr and a second voltage value VL lower than the reference voltage value Vr. The current-detecting resistor 24 converts a current flowing through the excitation coil 22 into a voltage. The DC component detection unit 25 outputs a second voltage signal representing magnitude of a DC component of the voltage obtained through conversion by the current-detecting resistor 24. The second decision unit 26 outputs a second output signal having a voltage level switching between a high level and a low level depending on whether the second voltage signal output from the DC component detection unit 25 is greater than, or equal to or less than, a second threshold value V2. The low-pass filter 27 is provided between an input terminal of the excitation unit 23 and the excitation coil 22. The input terminal is electrically connected to a connection point between the excitation coil 22 and the current-detecting resistor 24.

This configuration allows the electric leakage detector 100 to improve the detection accuracy. Specifically, the electric leakage detector 100 reduces the chances of an AC leakage current, of which the amount is less than the first threshold value V1, being detected erroneously as a DC leakage current by the DC leakage detection section 2, thus improving the detection accuracy.

In the electric leakage detector 100, the correction unit 14 is implemented as a first low-pass filter 140 provided between the current detection unit 13 and the first decision unit 16. A cutoff frequency of the first low-pass filter 140 and a cutoff frequency of the low-pass filter 27 (a second low-pass filter 27) of the DC leakage detection section 2 are higher than the excitation frequency. An attenuation curve representing a frequency-gain characteristic of the second low-pass filter 27 has a steeper gradient than an attenuation curve representing a frequency-gain characteristic FG1 of the first low-pass filter 140. The attenuation curve representing the frequency-gain characteristic FG2 of the second low-pass filter and the attenuation curve representing the frequency-gain characteristic FG1 of the first low-pass filter 140 intersect with each other on a single graph in which these two attenuation curves share the same logarithmic axis of frequencies and the same gain axis in dB. This allows the electric leakage detector 100 to attenuate the AC leakage components input to the DC leakage detection section 2 while reducing the distortion of the voltage waveform of the current-detecting resistor 24.

In the electric leakage detector 100, the DC component detection unit 25 includes an integration circuit 250 and a feedback resistor 251. The integration circuit 250 includes: an operational amplifier 2501; a resistor 2502, one terminal of which is connected to an inverting input terminal of the operational amplifier 2501; and a capacitor 2503 connected between the inverting input terminal and an output terminal of the operational amplifier 2501. The integration circuit 250 is configured such that a reference voltage with a reference voltage value Vr is input to a non-inverting input terminal of the operational amplifier 2501, and that a voltage obtained through conversion by the current-detecting resistor 24 is input to the inverting input terminal of the operational amplifier 2501 via the resistor 2502. The feedback resistor 251 is connected between an output terminal of the integration circuit 250 and the other terminal of the resistor 2502. This allows the electric leakage detector 100 to stabilize the output level of the DC component detection unit 25 irrespective of dispersion between individual second cores 21 or the temperature characteristic thereof.

Figure 8:
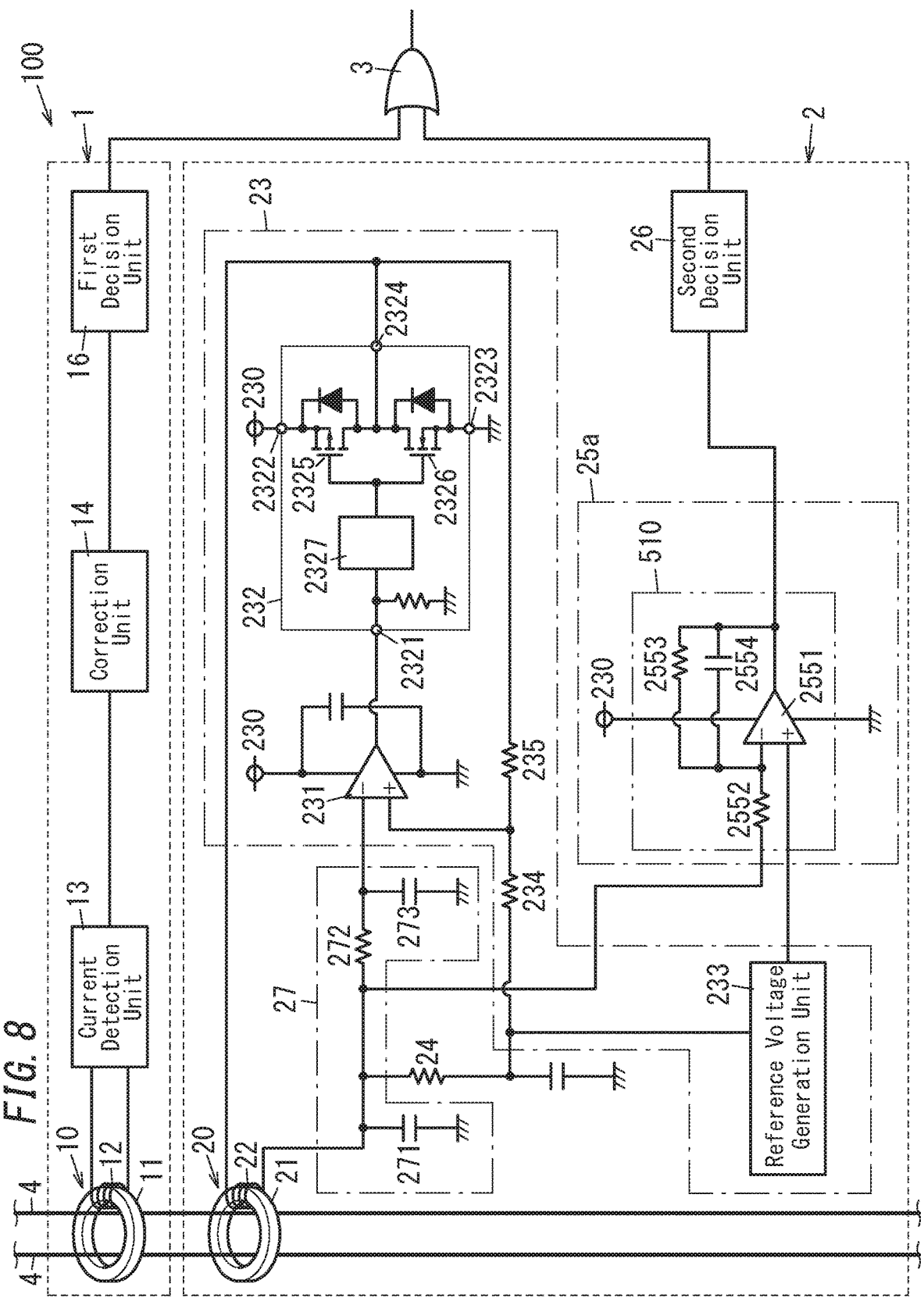
FIG. 8 is a schematic circuit diagram of an electric leakage detector according to a variation of the embodiment of the present invention.

A variation of the electric leakage detector 100 may include, instead of the DC component detection unit 25, an alternative DC component detection unit 25*a* implemented as a low-pass filter 510 (hereinafter referred to as a "third low-pass filter 510") including an operational amplifier 2551 as shown in FIG. 8, for example. In other words, in the electric leakage detector 100, the DC component detection unit 25*a* may include the third low-pass filter 510. This allows the electric leakage detector 100 to implement the DC component detection unit 25*a* with a simple configuration. The DC component detection unit 25*a* includes the operational amplifier 2551, two resistors 2552, 2553, and a capacitor 2554. In the DC component detection unit 25*a*, the non-inverting input terminal of the operational amplifier 2551 is connected to the reference voltage generation unit 233. This allows the DC component detection unit 25*a* to receive a reference voltage with the reference voltage value Vr at the non-inverting input terminal of the operational amplifier 2551. In addition, in the DC component detection unit 25*a*, the inverting input terminal of the operational amplifier 2551 is connected to a connection point between the current-detecting resistor 24 and the excitation coil 22 via the resistor 2552. This allows the DC component detection unit 25*a* to receive, via the resistor 2552, the voltage obtained through conversion by the current-detecting resistor 24 at the inverting input terminal of the operational amplifier 2551. Furthermore, in the DC component detection unit 25*a*, a parallel circuit of the resistor 2553 and the capacitor 2554 is connected between the output terminal and inverting input terminal of the operational amplifier 2551.

The DC component detection unit 25*a* outputs a DC component included in the output voltage of the second current-detecting resistor 24 to the second decision unit 26 by attenuating high frequency components included in the output voltage of the second current-detecting resistor 24. In this embodiment, the voltage signal output from the DC component detection unit 25*a* comes to have a voltage value proportional to the amount of the DC leakage current flowing through the conductors 4.

In the configuration shown in FIG. 1, the excitation unit 23 includes the operational amplifier 231 and the voltage switching circuit 232. However, this is only an example and should not be construed as limiting. Alternatively, these functions may be implemented as a single circuit component (such as a single operational amplifier).

REFERENCE SIGNS LIST

100 Electric Leakage Detector
1 AC Leakage Detection Section
11 First Core
12 Secondary Coil
13 Current Detection Unit
14 Correction Unit
140 Low-Pass Filter (First Low-Pass Filter)
16 First Decision Unit
2 DC Leakage Detection Section
21 Second Core
22 Excitation Coil
23 Excitation Unit
24 Current-Detecting Resistor
25, 25a DC Component Detection Unit
250 Integration Circuit
2501 Operational Amplifier
2502 Resistor
2503 Capacitor
251 Feedback Resistor
26 Second Decision Unit
27 Low-Pass Filter (Second Low-Pass Filter)
510 Third Low-Pass Filter
Vr Reference Voltage Value
VH First Voltage Value
VL Second Voltage Value
FG1 Frequency-Gain Characteristic of First Low-Pass Filter
FG2 Frequency-Gain Characteristic of Second Low-Pass Filter

The invention claimed is:

1. An electric leakage detector comprising:
an AC leakage detection section configured to detect an AC leakage current;
a DC leakage detection section configured to detect a DC leakage current; and
an OR circuit configured to calculate a logical sum of a first output signal output from the AC leakage detection section and a second output signal output from the DC leakage detection section,
the AC leakage detection section including:
a first core configured to allow a plurality of conductors to pass therethrough;
a secondary coil wound around the first core;
a current detection unit configured to output a first voltage signal with a signal level corresponding to amplitude of an alternating current flowing through the secondary coil;
a correction unit configured to output a corrected first voltage signal by decreasing the signal level of the first voltage signal more and more significantly as an excess of a frequency of the first voltage signal output from the current detection unit over a predetermined frequency increases; and
a first decision unit configured to output the first output signal with a signal level switching between a high level and a low level depending on whether the corrected first voltage signal output from the correction unit is greater than, or equal to or less than, a first threshold value,
the DC leakage detection section including:
a second core configured to allow the plurality of conductors to pass therethrough;
an excitation coil wound around the second core;
a current-detecting resistor configured to convert a current flowing through the excitation coil into a voltage;
an excitation unit configured to apply, to the excitation coil, an excitation voltage, having an excitation frequency with a voltage level alternately changing between a first voltage value higher than a reference voltage value and a second voltage value lower than the reference voltage value, based on a result of comparison between the voltage obtained through conversion by the current-detecting resistor and a threshold voltage;
a DC component detection unit configured to output a second voltage signal representing magnitude of a DC component of the voltage obtained through conversion by the current-detecting resistor,
a second decision unit configured to output the second output signal having a voltage level switching between a high level and a low level depending on whether the second voltage signal output from the DC component detection unit is greater than, or equal to or less than, a second threshold value; and
a low-pass filter provided between an input terminal of the excitation unit and the excitation coil, the input terminal being electrically connected to a connection point between the excitation coil and the current-detecting resistor.

2. The electric leakage detector of claim 1, wherein
the correction unit is implemented as a first low-pass filter provided between the current detection unit and the first decision unit,
a cutoff frequency of the first low-pass filter and a cutoff frequency of a second low-pass filter, which serves as the low-pass filter of the DC leakage detection section, are higher than the excitation frequency,
an attenuation curve representing a frequency-gain characteristic of the second low-pass filter has a steeper gradient than an attenuation curve representing a frequency-gain characteristic of the first low-pass filter, and
the attenuation curve representing the frequency-gain characteristic of the second low-pass filter and the attenuation curve representing the frequency-gain characteristic of the first low-pass filter intersect with each other on a single graph in which the two attenuation curves share the same logarithmic axis of frequencies and the same gain axis in dB.

3. The electric leakage detector of claim 1, wherein
the DC component detection unit includes a third low-pass filter.

4. The electric leakage detector of claim 1, wherein
the DC component detection unit includes an integration circuit and a feedback resistor,
the integration circuit includes: an operational amplifier; a resistor, one terminal of which is connected to an inverting input terminal of the operational amplifier; and a capacitor connected between the inverting input terminal and an output terminal of the operational amplifier, the integration circuit being configured such that a reference voltage with the reference voltage value is input to a non-inverting input terminal of the operational amplifier and that the voltage obtained through conversion by the current-detecting resistor is input to the inverting input terminal of the operational amplifier via the resistor, and the feedback resistor is connected between an output terminal of the integration circuit and the other terminal of the resistor.

5. The electric leakage detector of claim 2, wherein the DC component detection unit includes a third low-pass filter.

6. The electric leakage detector of claim 2, wherein the DC component detection unit includes an integration circuit and a feedback resistor, the integration circuit includes: an operational amplifier; a resistor, one terminal of which is connected to an inverting input terminal of the operational amplifier; and a capacitor connected between the inverting input terminal and an output terminal of the operational amplifier, the integration circuit being configured such that a reference voltage with the reference voltage value is input to a non-inverting input terminal of the operational amplifier and that the voltage obtained through conversion by the current-detecting resistor is input to the inverting input terminal of the operational amplifier via the resistor, and the feedback resistor is connected between an output terminal of the integration circuit and the other terminal of the resistor.

\* \* \* \* \*